(12) United States Patent
Morgan

(10) Patent No.: US 6,400,613 B1
(45) Date of Patent: Jun. 4, 2002

(54) POSITIVE WRITE MASKING METHOD AND APPARATUS

(75) Inventor: Donald M. Morgan, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/799,222

(22) Filed: Mar. 5, 2001

(51) Int. Cl.[7] .................................................. G11C 7/00
(52) U.S. Cl. ........................... 365/189.01; 365/189.08; 365/189.05
(58) Field of Search ...................... 365/189.01, 189.08, 365/189.05

(56) References Cited

U.S. PATENT DOCUMENTS

| | | | |
|---|---|---|---|
| 5,276,642 A | 1/1994 | Lee | 365/189.04 |
| 5,282,177 A | 1/1994 | McLaury | 365/230.05 |
| 5,506,814 A | 4/1996 | Hush et al. | 365/230.03 |
| 5,623,624 A | 4/1997 | Holland et al. | 395/432 |
| 5,699,314 A | 12/1997 | Hush et al. | 365/230.03 |
| 5,703,826 A | 12/1997 | Hush et al. | 365/230.05 |
| 5,737,761 A | 4/1998 | Holland et al. | 711/165 |
| 5,813,023 A * | 9/1998 | McLaury | 365/189.08 |
| 5,907,512 A | 5/1999 | Parkinson et al. | 365/195 |
| 6,011,727 A | 1/2000 | Merritt et al. | 365/189.02 |
| 6,044,026 A | 3/2000 | Morgan | 365/194 |
| 6,055,208 A | 4/2000 | Morgan et al. | 365/233 |
| 6,072,749 A * | 6/2000 | Nakamura et al. | 365/189.01 |
| 6,075,721 A * | 6/2000 | Runaldue et al. | 365/154 |
| 6,175,526 B1 | 1/2001 | Morgan | 365/194 |
| 6,195,762 B1 | 2/2001 | Shore | 714/8 |
| 6,205,085 B1 | 3/2001 | Morgan et al. | 365/233 |

* cited by examiner

Primary Examiner—Huan Hoang
(74) Attorney, Agent, or Firm—Schwegman, Lundberg, Woessner & Kluth, P.A.

(57) ABSTRACT

Systems and methods are provided for positively masking input signals for a circuit. The positive write masking circuit prevents a transition through a potentially destructive intermediate circuit state as it transitions from an initial circuit state to the final circuit state when the two input signals make a transition between signal states. One embodiment presets the mask state signal to a Mask signal state after a first state signal makes a transition from an Active signal state to an Idle signal state. The mask state signal must then make a positive transition to an Unmask signal state before the circuit is able to generate a potentially destructive output signal.

53 Claims, 8 Drawing Sheets

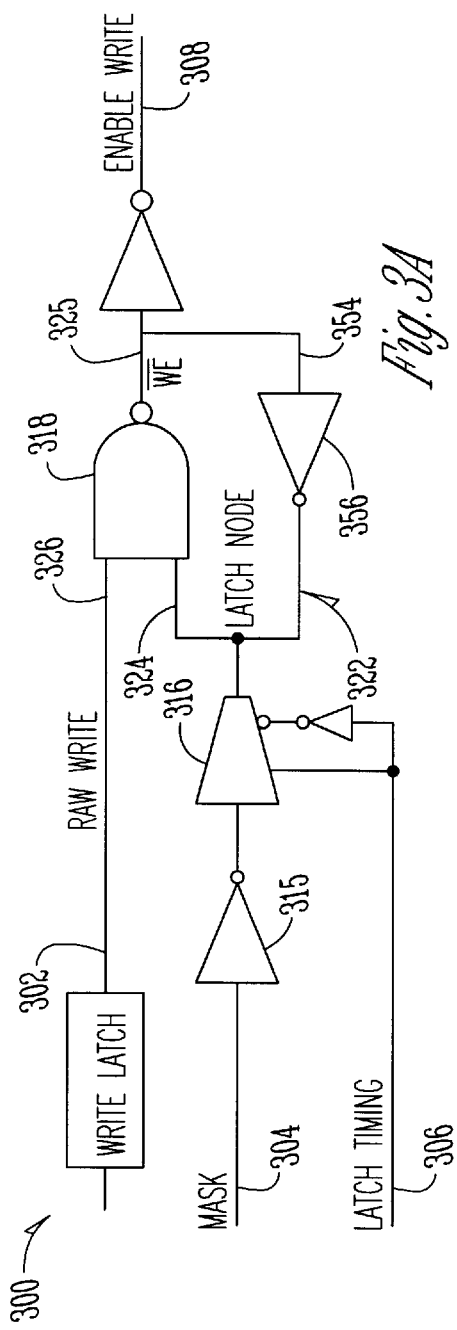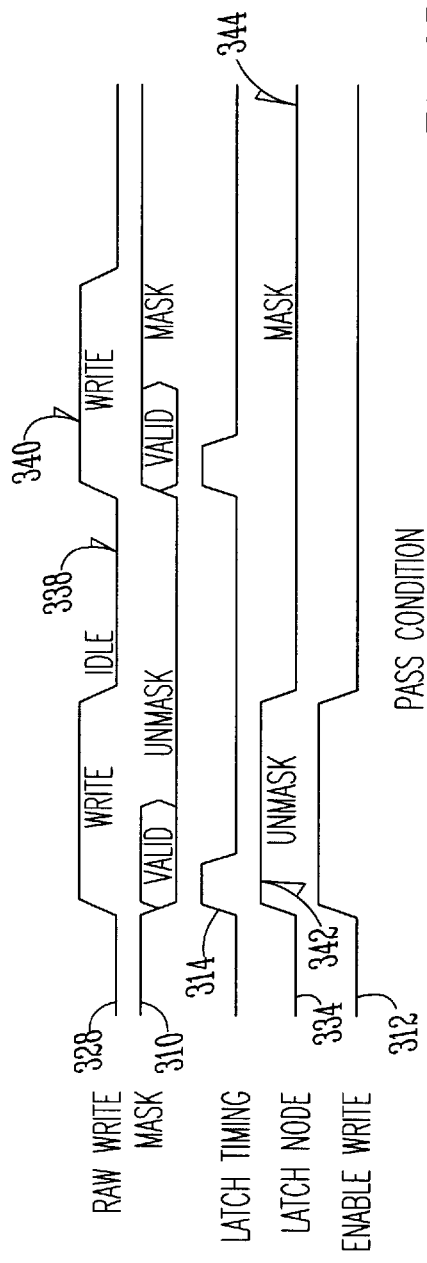

POSITIVE WRITE MASKING METHOD AND APPARATUS

TECHNICAL FIELD OF THE INVENTION

This invention relates generally to integrated circuits, and in particular to systems and methods for preventing late-arriving control signals from initiating an intermediate, potentially destructive state between an initial state and an intended final state.

BACKGROUND OF THE INVENTION

A logic control circuit switches between or among circuit states when input control signals make transitions between signal states. These circuit states may be classified either as non-destructive or as potentially destructive. For example, a circuit state in which a write enable signal is transmitted from the control circuit to a memory cell may be classified as potentially destructive because a write will change the character of the memory cell. Although an intentional write causes desired data to be stored in the memory cell, an unintentional write or partial write can damage the data contained in the memory cell.

One example in which the above-described problem may occur is in a mask write function for a memory device. The mask write function enables or disables particular write control signals or commands such that the circuit will ignore a write control signal if a mask control signal is in a Mask signal state.

One reason for performing a mask write function is to maintain backward compatibility with data systems as new, more power systems are developed. For example, some newer systems use a wider data format such as a sixteen bit (two byte) word. Thus, there are sixteen bits of storage for each unique address. Older systems may only use 8 bits and would therefore not be able to write the entire double word in one pass. Masking part of the data to protect from an unintended write makes it possible to make full use of the new hardware by using two passes to write two 8 bit words in the addressed double word space.

Another reason for masking is that, in some situations, it is desirable for a processor to change some subset of bits within a word, i.e. to provide the processor with "byte addressability." One example in which byte addressability is desirable is to implement parity memory. A processor that has byte addressability possesses a write-per-bit function. The mask write function eliminates the need for the processor to change individual bits by performing a Read-Modify-Write cycle, wherein the processor reads all bits from an address location to determine the data stored in the memory location, modifies the bits it wants to change, and then writes the modified information back into the memory location.

When two control signals make transitions between signal states, one control signal may arrive at the logic control circuit later than the other control signal. An unintended consequence of changing signal states in two or more control signals is that the circuit may move from an initial state and enter an intermediate, potentially destructive state upon the arrival of the first control signal, and then move to the intended final state upon the arrival of the second control signal.

Therefore, there is a need in the art to provide a system and method that overcomes these problems.

SUMMARY OF THE INVENTION

The above mentioned problems are addressed by the present subject matter and will be understood by reading and studying the following specification. The present subject matter provides for a system and method for preventing late-arriving control signals from initiating an intermediate, potentially destructive state as a logic circuit makes a transition between an initial state and an intended final state. The logic circuit receives two or more input signals or control signals, such as a first input signal and a mask signal. Each of these input signals have two signal states, and each combination of input signal states produces an output signal and corresponds to a logic circuit state. The logic circuit states may be characterized either as non-destructive or potentially destructive, depending on whether a non-destructive or potentially destructive output signal is produced. When two input or control signals make a transition between signal states, both input signal transitions may not be received or detected simultaneously. Therefore, the circuit makes a transition from the initial state, into an intermediate state upon the arrival of the first input signal, and into the final state upon the arrival of the second input signal. The present subject matter directs the circuit through a non-destructive intermediate state. One embodiment presets the latched mask control signal to a Mask signal state after the first control signal makes a transition from an Active signal state to an Idle signal state. Another embodiment periodically resets the first control signal from the Active signal state to the Idle signal state, and presets the mask control signal to the Mask signal state after the first control signal makes a transition from the Active signal state to the Idle signal state.

One aspect provides a circuit, and one embodiment thereof comprises a gate, a first line, a second line and a feedback line. The gate has a first input, a second input and an output. A raw signal is presented to the first input of the gate on the first line. The raw signal makes transitions between two signal states; i.e. an Active signal state and an Idle signal state. A first control signal is presented to the second input of the gate on the second line. The first control signal makes transitions between two signal states; i.e. the Mask signal state and the Unmask signal state. The feedback line latches the output of the gate to the second input of the gate to reset the control signal to the Mask signal state after the raw signal makes a transition from the Active signal state to the Idle signal state.

One embodiment of the circuit comprises a first input node, a second input node, and an output node. A first state signal makes transitions between an Active signal state and an Idle signal state on the first input node. A second state signal makes transitions between a Mask signal state and an Unmask signal state on the second input node. An output signal, corresponding to the first state signal and the second state signal, is generated on the output node. The first state signal and the second state signal provide the circuit with non-destructive states that include an Idle Unmask state, an Idle Mask state, and an Active Mask state. The first state signal and the second state signal further provide at least one potentially destructive state, which corresponds to a potentially destructive output signal, that includes an Active Unmask state. A transition from the non-destructive Idle Unmask state to the non-destructive Active Mask state progresses through the intermediate, non-destructive Idle Mask state rather than through the potentially destructive Active Unmask state.

These and other aspects, embodiments, advantages, and features will become apparent from the following description of the invention and the referenced drawings.

BRIEF DESCRIPTION OF THE DRAWINGS

FIG. 3A is a schematic for one write masking circuit embodiment of the present inventions.

FIG. 3B illustrates signal wave forms for the write masking circuit of FIG. 3A operating in a Pass Condition, wherein the Latch Timing Signal is not late with respect to the Raw Write Signal.

Detailed Description of the Invention

Figure 1A:
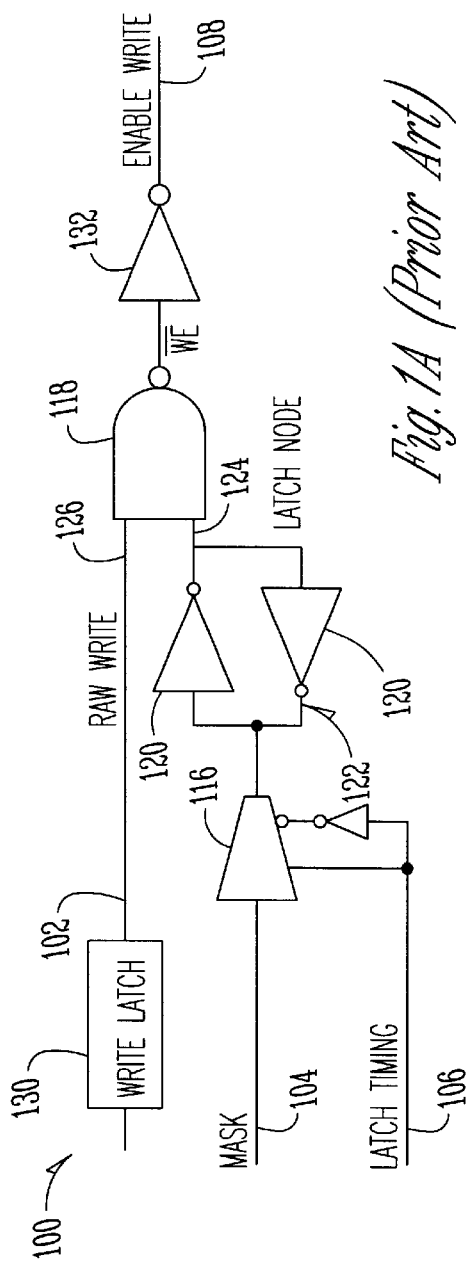
FIG. 1A is a schematic for a known write masking circuit.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 1B:
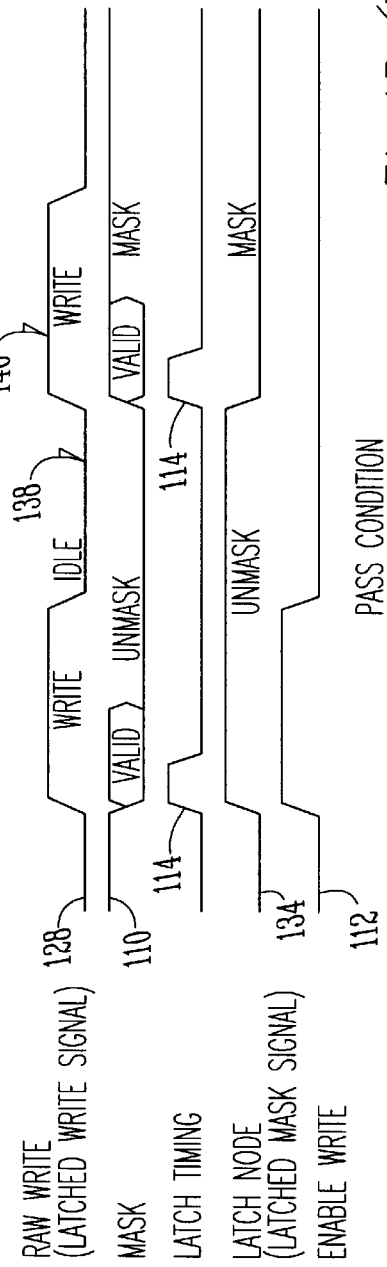
FIG. 1B illustrates signal wave forms for the write masking circuit of FIG. 1A operating in a Pass Condition, wherein the Latch Timing Signal is not late with respect to the Raw Write Signal.
Figure 1C:
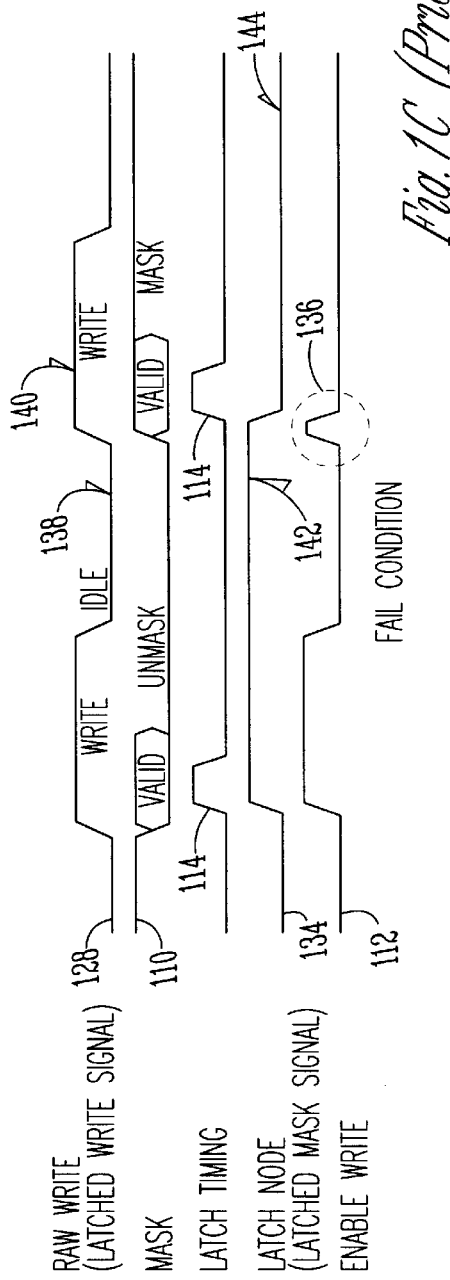
FIG. 1C illustrates signal wave forms for the write masking circuit of FIG. 1A operating in a Fail Condition, wherein the Latch Timing Signal is late with respect to the Raw Write Signal.

FIG. 1A shows a conventional mask write circuit 100 which can suffer from the above-described timing problem, and FIGS. 1B and 1C illustrate signal wave forms for the conventional mask write circuit 100. The mask write circuit 100 is connected to three inputs; namely, a Raw Write line 102, a Mask line 104, and a Latch Timing line 106. The mask write circuit 100 is also connected to an output, namely, an Enable Write line 108 in this embodiment. An externally-provided mask control signal 110, shown in FIG. 1B, on the Mask line 104 prevents the data on the Raw Write line 102 from being transmitted as an output on the Enable Write line 108. Since the externally-provided mask control signal 110 may only be present for a short period of time as indicated in FIGS. 1B and 1C by the portions marked "valid," the Latch Timing line 106 presents a latch pulse 114, also shown in FIGS. 1B and 1C, such as that which may be extracted from a clock signal, to temporarily allow the mask control signal 110 to pass through a transmission gate 116 and be latched at the input of a logic gate 118. A complementary pair of invertor gates 120 provide a mask latch 122. Thus, the mask latch 122 holds on to the value of the temporarily valid mask control signal 110 as required throughout a cycle.

As shown in FIG. 1A, the logic gate 118 has at least two inputs. One input 124 serves as a latch node that receives the latched mask control signal 134 (shown in FIGS. 1B and 1C) from the mask latch 122, and another input 126 receives the write control signal or Raw Write signal 128 (shown in FIGS. 1B and 1C), which may be latched by a write latch 130. FIG. 1A shows an example in which the logic gate 118 is a NAND gate with two inputs. When the Mask control signal 110 is low, i.e. a No Write Mask control signal is present on the Mask line 104, the invertors 120 in the latch 122 provide at the latch node a high latched mask control signal 134 to the NAND gate 118 on input 124 such that a high Raw Write signal 128 will produce a low output from the NAND gate 118 for the active-low *WE signal. An inverter 132 transfers the active-low *WE signal into the active-high Enable Write signal 112 (shown in FIGS. 1B and 1C). However, if the Mask control signal 110 is high, i.e. a Write Mask control signal is present on the mask line 104, the invertors 120 in the latch 122 provide at the latch node a latched mask control signal 134 to the NAND gate 118, which provides a high output for the active-low *WE signal and a low output for the active-high Enable Write line 108, regardless of the status of the Raw Write line 102.

FIGS. 1B and 1C illustrate a timing problem that is associated with conventional mask write circuits and methods. FIG. 1B illustrates signal wave forms for the write masking circuit 100 of FIG. 1A operating in a Pass Condition in which the Latch Timing signal pulses 114 are not late with respect to the Raw Write signal 128. Thus, the signal state transitions for both the mask control signal and the write control signal occur simultaneously. However, as illustrated in FIG. 1C, the mask signal may arrive at the mask write control circuit later than a write signal. FIG. 1C illustrates signal wave forms for the write masking circuit 100 of FIG. 1A operating in a Fail Condition in which the Latch Timing signal pulses 114 are late with respect to the Raw Write signal 128. This situation causes the conventional mask write circuit 100 to produce a potentially destructive pulse 136 that lasts for a period of time after the Raw Write signal 128 is received until the latched mask control signal 134 is received by the mask write circuit 100. That is, when the mask control signal or latch timing signal arrives late, the write control signal 128 that was intended to be masked may in fact "false start" or start to execute prior to receiving the mask control signal 110. This false start produces a risk of disrupting data stored in a memory.

Figure 2:
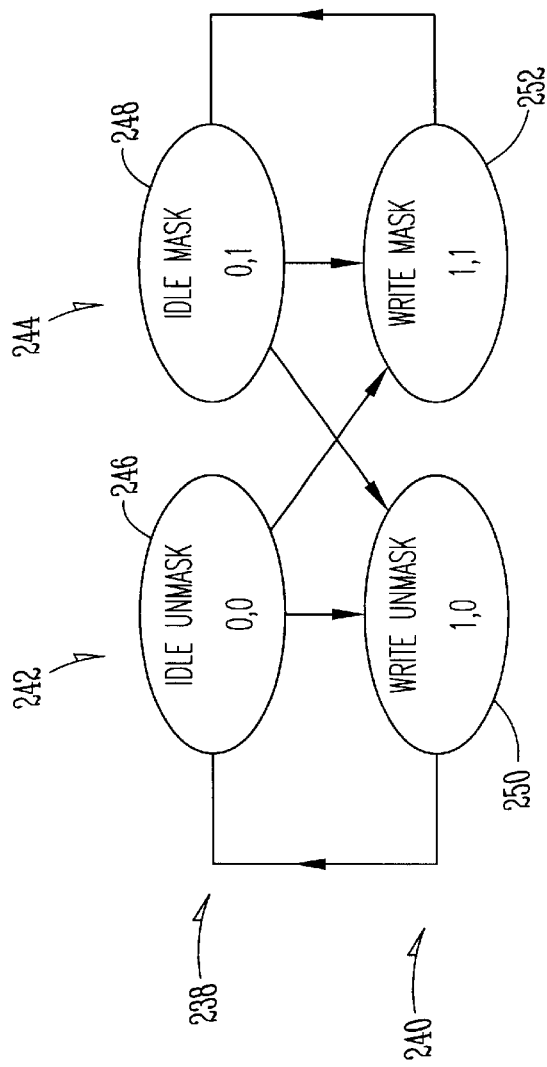
FIG. 2 is a state diagram for the write masking circuit of FIG. 1A.

FIG. 2 is a state diagram that illustrates four states that can occur in the write masking circuit 100 of FIG. 1A because of a raw write latch 130 and its associated Idle and Write signal states shown in FIGS. 1B and 1C at 138 and 140, and because of the mask latch 122 and its associated Unmask and Mask signal states shown in FIGS. 1B and 1C at 142 and 144. These four circuit states are an Idle Unmask state 246, an Idle Mask state 248, a Write Unmask state 250, and a Write Mask state 252. The circuit 100 proceeds through the circuit states as indicated by the arrows. The quantity and arrangement of the arrows between the circuit states is determined by the circuit design. For example, referring to FIGS. 1A, 1B and 1C, it is shown that the Latch Timing pulse 114 is triggered at the beginning of each Raw Write cycle 128. Thus, the circuit moves between the states illustrated in FIG. 2 at the beginning of each Raw Write cycle or Latch Timing pulse. The circuit will not move directly between the Idle Mask state 248 and the Idle Unmask state 246 or directly between the Write Mask state 252 and the Write Unmask state 250 because of the design of the circuit.

The state diagram of FIG. 2 is laid out in a form of a table that comprises two rows and two columns. The rows correspond to the signal state for the Raw Write control signal 128, wherein the first row corresponds to an Idle signal state 238 and the second row corresponds to a Write signal state 240. The columns correspond to the signal state for the latched mask control signal 134, wherein the first column corresponds to an Unmask signal state 242 and the second column corresponds to a Mask signal state 244. FIG. 2 illustrates that making a horizontal or vertical transition to an adjacent state only requires a transition in one state variable, and thus does not introduce a race between the latched mask and write control signals. However, making a diagonal transition requires a transition in two state variables, i.e. a transition between the two signal states for each of the control signals provided by the mask latch 122 and the write latch 130, and inherently generates a race between the latched mask and write control signals.

Referring to FIG. 2 along with FIGS. 1B and 1C, it is seen that the race between state variables may be critical or noncritical. For example, the transition between the Idle Mask state 248 and the Write Unmask state 250 involves a noncritical race between the latched write control signal 128 and the latched mask control signal 134 because temporarily entering either the Write Mask state 252 or the Idle Unmask state 246 will not cause destructive or potentially destructive results. A write cannot occur within the Write Mask state 252 because the latch mask signal 134 is in the Mask signal state 144, and cannot occur within the Idle Unmask state because the latched write signal 128 is in the Idle signal state 138. However, the transition between the Idle Unmask state 246 and the Write Mask state 252 involves a critical race between the latched write and mask control signals. Although temporarily entering the Idle Mask state 248 is not destructive, temporarily entering the Write Unmask state 250 is at least potentially destructive. This is illustrated in FIG. 1C as the Enable Write pulse 136 is generated when the raw write control signal 128 makes a transition to a Write signal state 140 as the latched mask control signal 134 makes a transition to the Mask signal state 144.

The present subject matter prevents late-arriving control signals from initiating an intermediate, potentially destructive state as a logic circuit makes a transition from an initial state to an intended final state, but rather directs the circuit through an non-destructive intermediate state instead. One embodiment presets the mask control signal to a Mask signal state after a first control signal makes a transition from an Active signal state to an Idle signal state. The mask control signal must then make a positive transition to an Unmask signal state before the circuit is able to generate a potentially destructive output signal. Another embodiment periodically resets the first control signal from the Active signal state to the Idle signal state, and presets the mask control signal to the Mask signal state after the first control signal makes a transition from the Active signal state to the Idle signal state. The first control signal must then make a positive transition to the Active signal state and the mask control signal must then make a positive transition to the Unmask signal state before the circuit is able to generate a potentially destructive output signal.

Figure 3C:
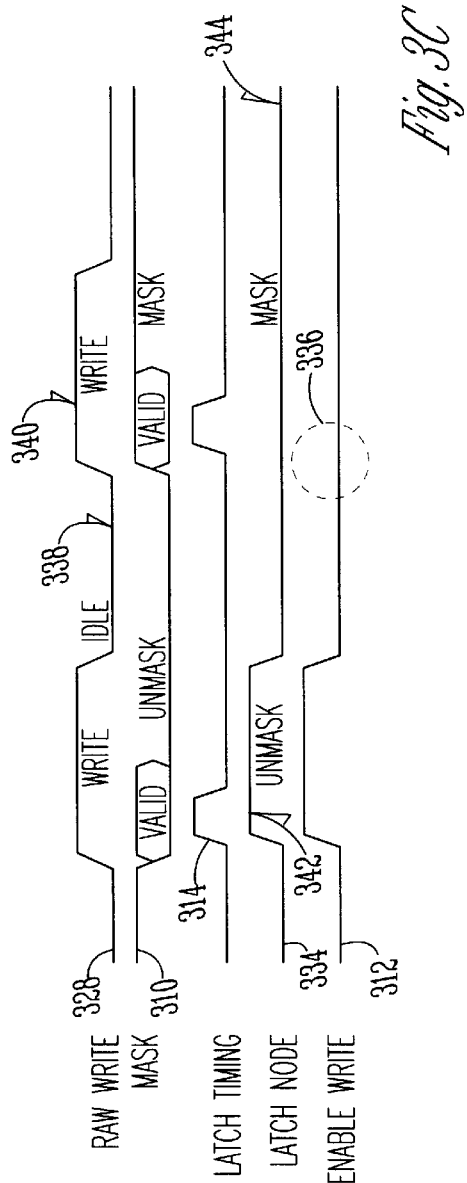
FIG. 3C illustrates signal wave forms for the write masking circuit of FIG. 3A operating in a Pass Condition, wherein the Latch Timing Signal is late with respect to the Raw Write Signal.
Figure 7:
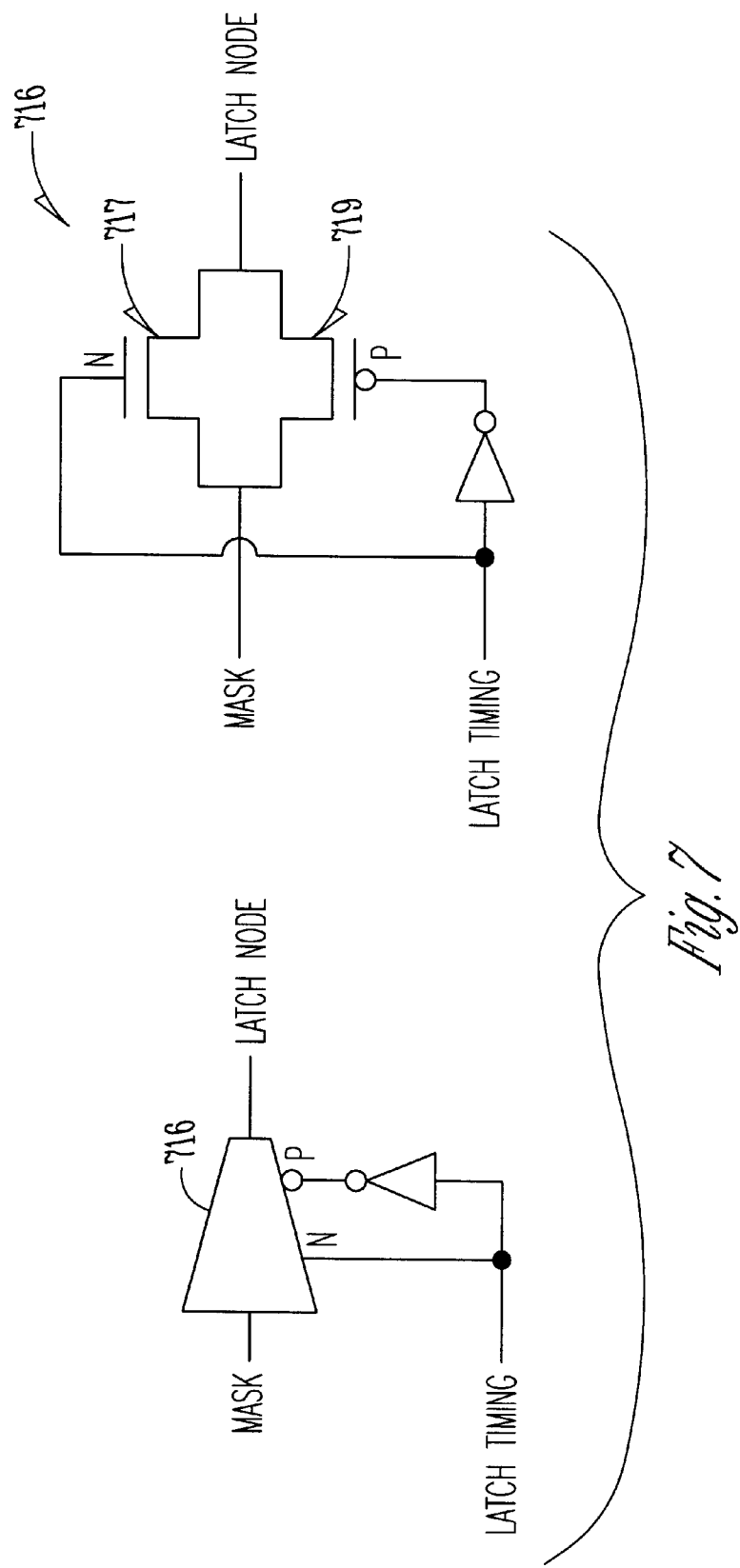
FIG. 7 illustrates a transmission gate as used in schematics of FIGS. 1A, 3A and 5.

One aspect, illustrated in FIG. 3A, provides a circuit 300 that comprises a gate 318, a first line 302, a second line 304 and a feedback line 354. FIGS. 3B and 3C illustrate signal wave forms for the circuit 300. The gate 318 has a first input 326, a second input 324 and an output 325. The illustrated gate 318 comprises a NAND gate. A raw signal 328, such as a Raw Write signal that is illustrated in FIGS. 3B and 3C for example, is presented to the first input 326 of the gate 318 on the first line 302. The raw signal 328 functions as a state signal as it makes transitions between two signal states; i.e. an Idle signal state 338 and an Active signal state 340. A first control signal 310, such as a mask control signal as illustrated in FIGS. 3B and 3C for example, is presented on the second line 304 through an inverter 315 and a transmission gate 316 to the second input 324 of the gate 318. The feedback line 354 latches the output 325 of the gate 318 to the second input 324 of the gate 318. Thus, the second input 324 serves as a latch node upon which a latched first control signal 334 is presented to the gate 318. The latched first control signal 334 functions as a state signal as it makes transitions between two signal states; i.e. the Unmask signal state 342 and the Mask signal state 344. The illustrated feedback line 354 comprises an inverting gate 356. One embodiment of the circuit 300 includes a third line 306 that presents a second control signal pulse 314 to the transmission gate 316. The second control signal 314 controls whether the first control signal 310 passes through the transmission gate 316 and is presented to the second input 324 of the gate 318 where it is latched by the combination of the NAND gate 318 and the inverter 356 in the feedback line 354. FIG. 7 illustrates a transmission gate 716 that comprises an NMOS transistor 717 and a PMOS transistor 719 cooperatively arranged to pass a mask control signal through to the latch node when a latch timing pulse is present.

Figure 4:
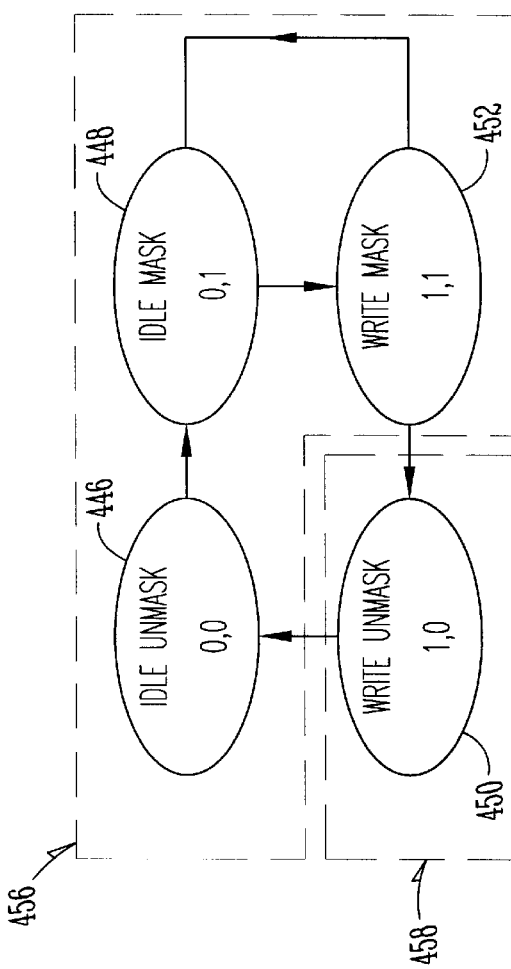
FIG. 4 is a state diagram for the write masking circuit of FIG. 3A.

FIG. 4 shows that the latched raw signal and the latched first control signal, previously described with respect to FIGS. 3B and 3C, provide at least one non-destructive circuit state 456 and at least one potentially destructive circuit state 458. The at least one non-destructive circuit state 456 includes an Idle Unmask state 446, an Idle Mask state 448, and an Active Mask state 452, and the at least one potentially destructive circuit state 458 includes an Active Unmask state 450. FIG. 4 substitutes the term Write for the term Active for a write mask circuit embodiment. A transition from the non-destructive Idle Unmask state 446 to the non-destructive Active Mask state 452 progresses through the non-destructive Idle Mask state 448 rather than through the potentially destructive Active Unmask state 450.

One embodiment of the circuit 300, as illustrated in FIGS. 3A, 3B and 3C, comprises a first input node 302, a second input node 324, and an output node 325. An inverter is positioned between the output node 325 and the enable write line 308, as shown in FIG. 3A. An enable write signal is transmitted on the enable write line 308. The inverter inverts the polarity for the signal between the output node 325 and the enable write line 308 to provide an active-high enable write signal, as shown at 312 in FIG. 3B. A first state signal 328 makes transitions between an Active signal state 340 and an Idle signal state 338 on the first input node 326. A second state signal 334 makes transitions between the Mask signal state 344 and an Unmask signal state 342 on the second input node 324. An output signal 312, corresponding to the first state signal 328 and the second state signal 334, is generated on the output node 325. Referring collectively to FIGS. 3A, 3B, 3C and 4, the first state signal 328 and the second state signal 334 provide the circuit 300 with non-destructive states 456 that include an Idle Unmask state 446, an Idle Mask state 448, and an Active Mask state 452. The first state signal 328 and the second state signal 334 further provide at least one potentially destructive state 458 that includes an Active Unmask state 450. These states are illustrated in the state diagram of FIG. 4, which specifies an embodiment in which the first state signal 328 is a Raw Write state signal that makes transitions between a Write signal state and an Idle signal state. A transition from the non-destructive Idle Unmask state 446 to the non-destructive Active Mask state 452 progresses through the intermediate, non-destructive Idle Mask state 448 rather than through the potentially destructive Active Unmask state 450.

The second state signal 334 is reset to the Mask signal state 344 after the first state signal 328 makes a transition from the Active signal state 340 to the Idle signal state 338. This mask state reset function is performed in the illustrated circuit 300 of FIG. 3A by the feedback line 354 that is coupled between the output node 325 and the second input node 324 of the gate. The gate 318 and the feedback gate 356 of the illustrated circuit 300 comprise a NAND gate and an inverter gate respectively. When the latched mask control signal 334 is in an Unmask signal state 342 and the write control signal 328 is in a Write signal state 340, the output node 325 of the NAND gate will be active low. When the write control signal 328 makes a transition from the Write signal state 340 to an Idle signal state 338, the output node 325 of the NAND gate 318 will be high, which, due to the inverter gate 356 of the feedback line 354, resets and latches the second input 324 of the gate 318 to a Mask signal state 344. A mask latch 322 is formed by the NAND gate 318 and the inverter gate 356 of the feedback line 354. Thus, before a subsequent Enable Write signal 312 can occur within a Write Unmask state 450, the circuit 300 must first receive a mask control signal 334 that positively makes a transition from the Mask signal state 344 to the Unmask signal state 342. Comparing FIG. 1C to FIG. 3C illustrates the beneficial result when the Latch Timing signal is late with respect to the Raw Write signal. Whereas in FIG. 1C, the conventional circuit 100 would generate the pulse 136 on the Enable Write line 108, FIG. 3C shows at point 336 that the circuit 300 does not generate the pulse on the Enable Write line 308.

A transmission gate 316 is coupled to the second input node 324 in the embodiment illustrated in FIG. 3A. The transmission gate 316 passes the second state signal 310, such as the Mask state signal for example, for a period of time after the Active signal state 340 is generated on the first input node 326 and isolates the second input node 324 after the period of time until the next Active signal state 340 is generated on the first input node 326. By isolating the second node input 324, the transmission gate 316 allows the mask latch 322 and thus the latch mask state signal 334 to be reset to the Mask signal state 344 after the first node 326 completes a transition between the Active signal state 340 to the Idle signal state 338. In one embodiment, the first state signal 328 is a Raw Write signal, which as illustrated in FIG. 4, provides non-destructive states 456 that include an Idle Unmask state 446, an Idle Mask state 448, and a Write Mask state 452, and further provides a potentially destructive state 458 that includes an Active Unmask state 450. When a transition is made from the potentially destructive Write Unmask state 450 to the non-destructive Idle Unmask state 446, the latch match state signal 334 is reset to the Mask signal state 344 which causes the circuit 300 to make a transition from the Idle Unmask state 446 to the Idle Mask state 448.

Figure 5A:
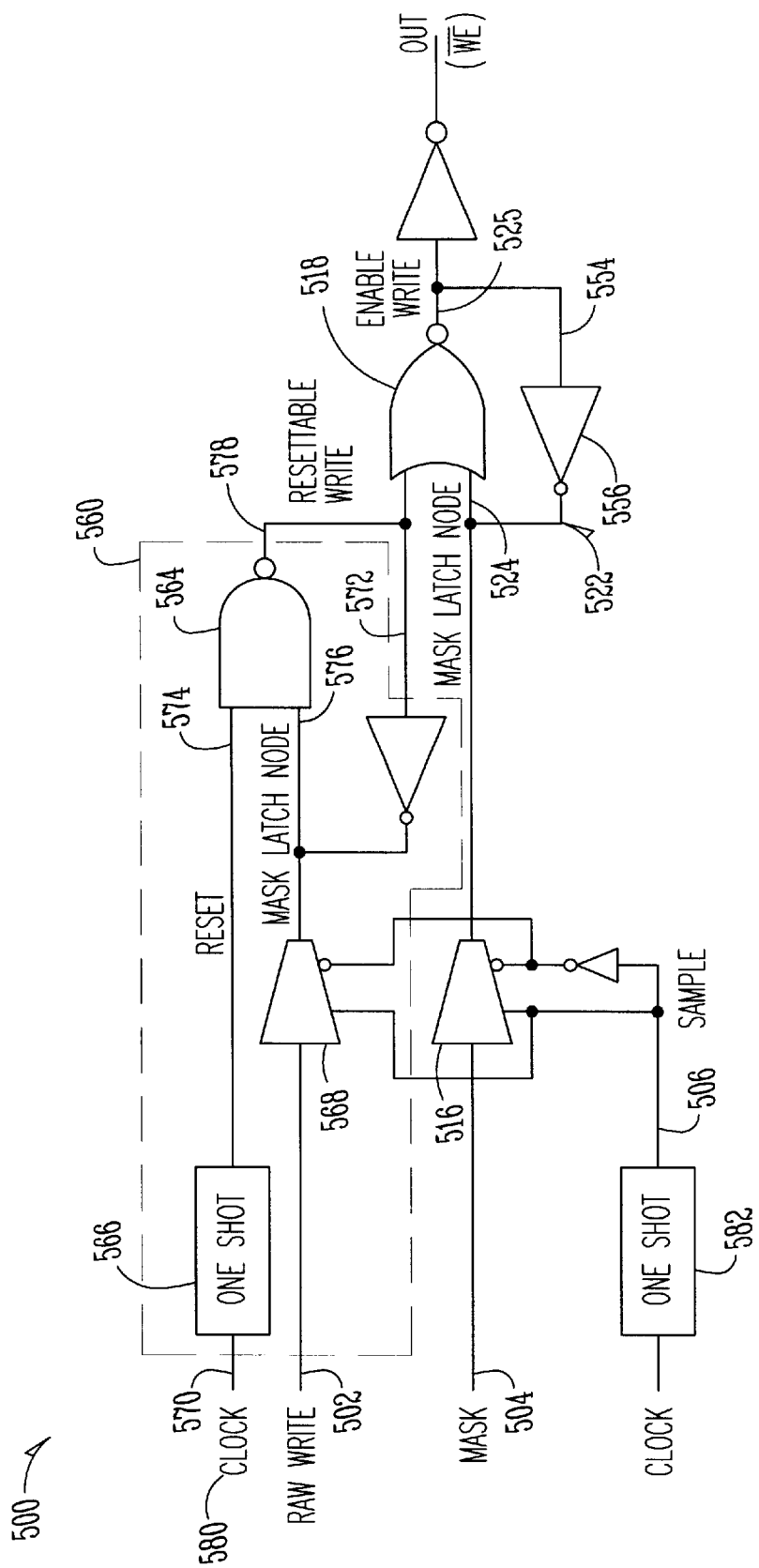
FIG. 5A is a schematic for another write masking circuit embodiment such as that which may be used for a SDRAM.
Figure 5B:
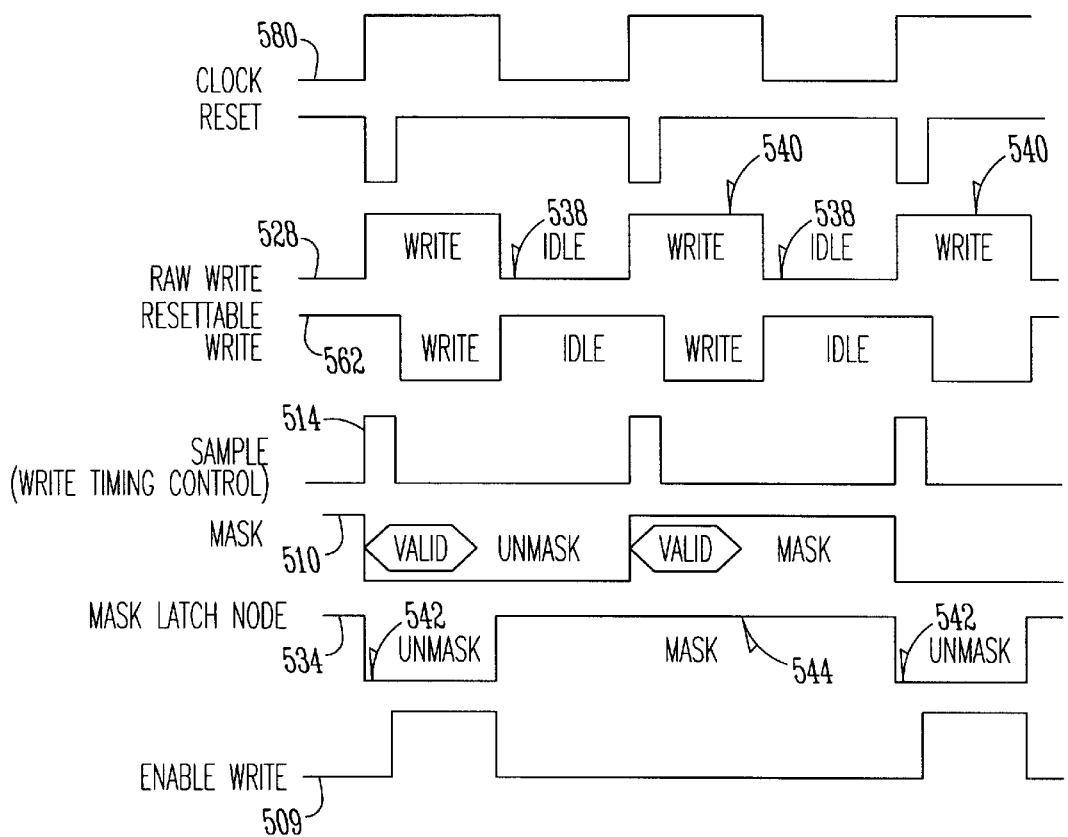
FIG. 5B illustrates signal wave forms for the write masking circuit of FIG. 5A.

One embodiment of a write masking circuit 500, as illustrated in FIGS. 5A and 5B, comprises a mask control gate 518, a resettable write portion 560, a mask line 504, a timing control line 506, and a feedback line 554. The mask control gate 518 has a first input 526, a second input 524 and an output 525. In one embodiment, the mask control gate 518 comprises a NOR gate. The resettable write portion 560 is coupled to a Raw Write line 502 and adapted for receiving a raw write control signal 528 on the raw write line 502 and presenting a resettable write signal 562 to the first input 526 of the mask control gate 518. The mask line 504 presents a mask control signal 510 to the second input 524 of the mask control gate 518. The mask signal 510 prevents the Raw Write signal 502 from producing an output signal 509 at the output 525 of the mask control gate. The timing control line 506 presents a timing control signal 514 that controls whether the mask control signal 510 passes to the second input 524 of the mask control gate 518. The feedback line 554 latches the output 525 to the second input 524 of the gate 518. In one embodiment, the feedback line 554 comprises an inverting gate 556.

A mask transmission gate 516 is positioned on the mask line 504, and a mask timing control line 506 presents a mask timing control signal 514 to the mask transmission gate 516. The mask timing control signal 514 controls whether the mask signal 510 passes through the transmission gate 516 to the second input 524 of the mask control gate 518. The inverter gate 556 and the NOR gate 518 form a mask latch 522, which holds a mask latch signal 534 at the second input or mask latch node 524 of the mask control gate 518.

According to one embodiment, the resettable write portion 560 includes a write control gate 564, a write reset pulse generator 566, the raw write line 502, a write transmission gate 568, a write timing control line 570, and a write feedback line 572. The write control gate 564 has a first input 574, a second input 576 and an output 578. One embodiment of the write control gate 564 comprises a NAND gate. The write reset pulse generator 566 is coupled to the first input 574 of the write control gate 564. In the embodiment illustrated in FIG. 5A, the write reset pulse generator 566 comprises a One Shot circuit that generates a pulse when triggered by a Clock signal 580. The raw write line 502 presents a raw write signal 528 to the second input 576 of the write control gate 564. The write timing control line 506 presents a write timing control signal 514 to the write transmission gate 568. The write timing control signal 514 controls whether the raw write signal 528 passes through the write transmission gate 568 to the second input 576 of the write control gate 564. In one embodiment, the write timing control signal 514 and the mask timing control signal 514 both are produced by a One Shot circuit 582 that generates a pulse when triggered by a Clock signal 580. FIG. 7 illustrates a design and function for a transmission gate 716, such as the gates 516 and 568 shown in FIG. 5A. The write feedback line latches the output of the write control gate to the second input of the write control gate. In one embodiment, the mask feedback line and the write feedback line each comprise an inverting gate.

The state diagram of FIG. 4 also applies to the write masking circuit illustrated in FIG. 5A. Thus, referring collectively to FIGS. 4, 5A, 5B and 5C, the raw write signal 528, the mask signal 510 and the timing control signal 514 provide at least one non-destructive circuit state 456 and at least one destructive circuit state 458. The non-destructive circuit states 456 include an Idle Unmask state 446, an Idle Mask state 448, and a Write Mask state 452. The destructive state 458 includes a Write Unmask state 450. A transition from the non-destructive Idle Unmask state 446 to the non-destructive Write Mask state 452 progresses through the non-destructive Idle Mask state 448 rather than through the potentially destructive Write Unmask state 450.

The second input of the write control gate 564 is periodically reset and latched to an Idle signal state 538. The second input 524 of the mask control gate 518 is reset and latched to a Mask signal state 544 in response to the reset second input or write latch node 576 of the write control gate 564. Thus, the write control signal 528 must make a positive transition to the Write signal state 540 and the mask control signal 510 must make a positive transition to the Unmask signal state 542 before the circuit 500 is able to generate a potentially destructive output signal 509.

Figure 6:
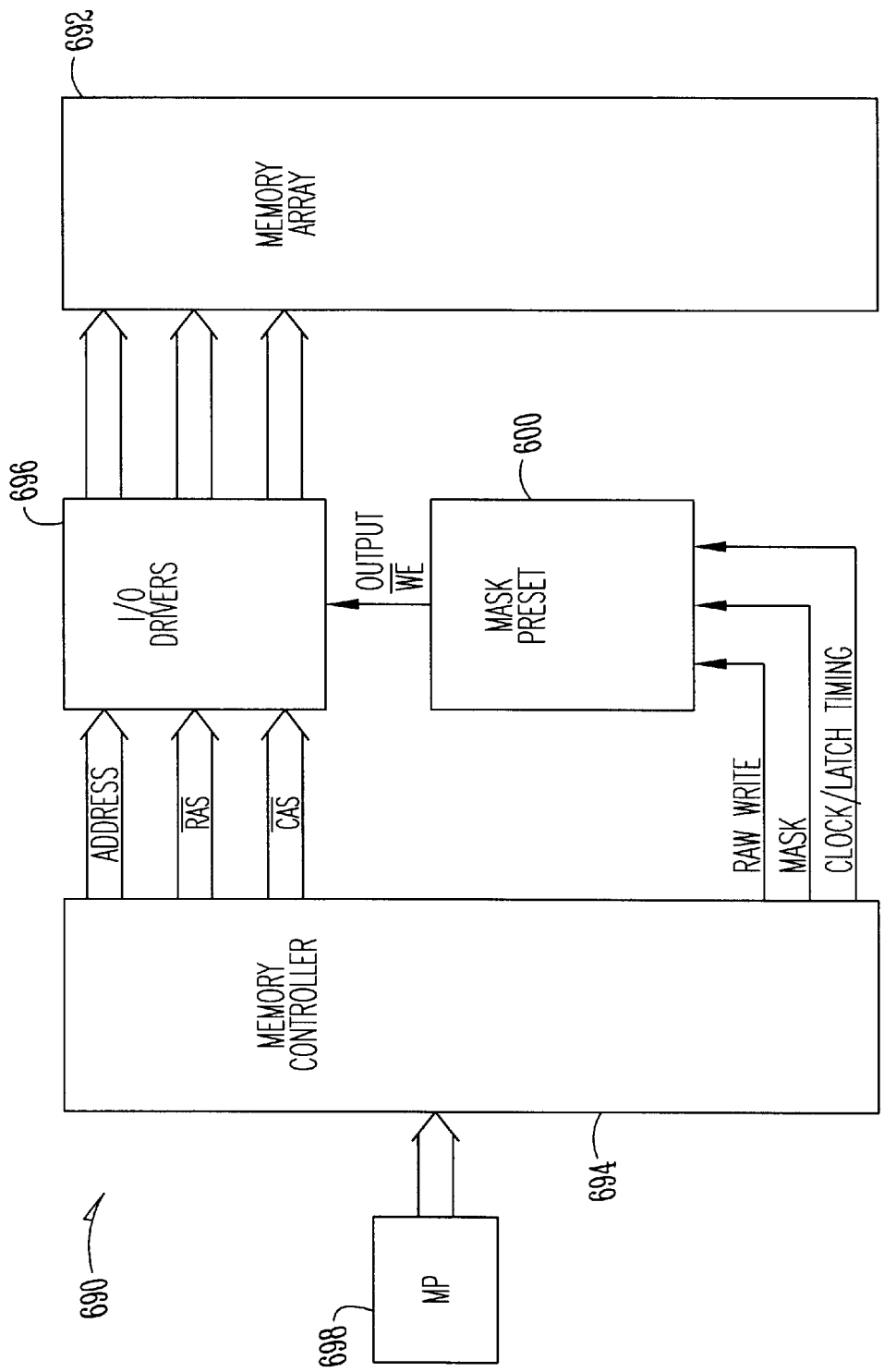
FIG. 6 is a block diagram of a memory with a microprocessor.

One aspect provides a memory device 690, as illustrated in FIG. 6. The memory device 690 comprises a memory array 692, a memory controller 694, and a mask preset logic control circuit 600. The memory array 692 includes a plurality of memory cells. The memory controller 694 provides addressing signals and control signals. These signals are used to write data to the memory array, and to retrieve data from the memory array. The control signals include a Raw Write signal, a Mask signal, and a Timing signal. The mask preset circuit 600 receives the Raw Write signal and the Mask signal, and produces a Write Enable signal that controls whether data is written to the memory array 692. One embodiment of the mask preset circuit comprises a first input node, a second input node, and an output node. The Raw Write signal makes transitions between a Write signal state and an Idle signal state on the first input node, and the Mask signal makes transitions between a Mask signal state and an Unmask signal state on the second input node. The Write Enable signal is generated on the output node. The Raw Write signal and the Mask signal provide an Idle Unmask state, an Idle Mask state, a Write Mask state, and a Write Unmask state. A transition between the Idle Unmask state to the Write Mask state progresses through the Idle Mask state.

The mask preset circuit 600 in one embodiment of the memory device 690 comprises a gate and a feedback line. The gate has a first input coupled to the Raw Write line, a second input coupled to the Mask line and an output adapted for providing the Write Enable signal. The feedback line latches the output of the gate to the second input of the gate. In one embodiment, the control signals include a Timing signal that controls whether the Mask signal is presented to the second input of the gate. A transmission gate is positioned on the Mask line. The control signals include a Timing signal that is presented to the transmission gate on a Latch Timing line. The Timing signal controls whether the Mask signal passes through the transmission gate and is presented to the second input of the gate. One embodiment of the memory device provides a mask preset circuit that includes a NAND gate. Another embodiment of the memory device includes an inverting gate as the feedback line.

One embodiment of the memory device 690 further comprises a latch positioned on the Raw Write line. The Raw Write signal makes transitions between an Active signal state and an Idle signal state and the first control signal makes transitions between a Mask signal state and an Unmask signal state. The Raw Write signal and the Mask control signal provide at least one non-destructive state that includes an Idle Unmask state, an Idle Mask state, and an Active Mask state, and further provide at least one potentially destructive state that includes an Active Unmask state. A transition between the non-destructive Idle Unmask state to the non-destructive Active Mask state progresses through the non-destructive Idle Mask state, rather than through the potentially destructive Active Unmask state.

Other aspects and embodiments of the mask preset circuit 600 are provided above, and will not be repeated here with respect to the memory device 690.

In one embodiment of the memory device 690, the Write Enable signal controls whether I/O drivers 696 are enabled. In various embodiments of the memory device 690, the I/O drivers 696 are formed either in the memory controller 694 or the memory array 692. In other embodiments, the memory controller 694 is incorporated into a[]microprocessor 698, or is coupled to the microprocessor 698.

Another aspect provides a write masking method that comprises providing a preset masking circuit, presenting a Raw Write signal and a Mask signal to the preset masking circuit. The Raw Write signal makes transitions between an Active or Write signal state and an Idle signal state, and the Mask signal makes transitions between a Mask signal state and an Unmask signal state. The write masking method further comprises making a transition from a non-destructive Idle Unmask state to a non-destructive Write Mask state through a non-destructive Idle Mask state rather than through the potentially destructive Write Unmask state.

One embodiment of the write masking method further comprises resetting the Mask signal to the Mask signal state upon completing a Raw Write signal transition from the Write signal state to the Idle signal state. Another embodiment of the write masking method comprises providing both a transmission gate and a latch positioned along a Mask line. Another embodiment further comprises providing a Latch Timing pulse to the transmission gate, wherein presenting a Mask signal comprises transmitting the Mask signal through a transmission gate and into a latch during the Latch Timing Pulse.

The figures presented and described in detail above are similarly useful in describing method aspects of the present subject matter. The methods described below are nonexclusive as other methods may be understood from the specification and the figures described above.

One method aspect provides a write masking method. A Raw Write signal is received. In response to receiving the Raw Write signal, a Resettable Write signal is generated. The Resettable Write signal is periodically reset from an Active signal state to an Idle signal state. A Mask signal that makes transitions between a Mask signal state and an Unmask signal state is received. The Resettable Write Signal and the Mask signal are presented to a mask control gate. An output signal is generated in response to receiving a mask signal in an Unmask signal state and to receiving a Resettable Write signal in an Active signal state. An inactive output signal is generated in response to receiving a mask signal in a Mask signal state or a Resettable Write signal in an Idle signal state. The Mask signal is presented to a Mask signal state by latching the inactive output signal to an input of the mask control gate. This write masking method is used in connection with the circuit 500 of FIG. 5A. One embodiment of the write masking method further comprises presetting the Raw Write signal to an Inactive signal state by latching an Idle Resettable Write signal to a line upon which the Raw Write signal is generated.

Another method aspect provides a method of protecting an integrated circuit. A first signal is provided, wherein the first signal makes transitions between an Active signal state and an Idle signal state. A second signal is provided, wherein the second signal makes transitions between a Mask signal state and an Unmask signal state. At least one non-destructive circuit state and at least one potentially destructive circuit state are formed from the first signal and the second signal. The at least one non-destructive circuit state includes an Idle Unmask state, an Idle Mask state, and an Active Mask state, and the at least one potentially destructive circuit state includes an Active Unmask state. A transition is made from the non-destructive Idle Unmask state to the non-destructive Active Mask state through the non-destructive Idle Mask state.

One embodiment of the method of protecting an integrated circuit further comprises resetting the second signal to the Mask signal state upon completing a first signal transition from the Active signal state to the Idle signal state. In another embodiment, the first signal is periodically reset and latched to the Idle signal state until a subsequent first signal is received in the Active signal state. The second signal is reset and latched to the Mask signal state until a subsequent second signal in an Unmask signal state is received.

Conclusion

The present subject matter provides methods and apparatus for a system and method for preventing late-arriving control signals from initiating an intermediate, potentially destructive state as a logic circuit makes a transition between an initial state and an intended final state. The present subject matter directs the circuit through a non-destructive intermediate state. One embodiment presets the mask signal to a Mask signal state after the first signal makes a transition from an Active signal state to an Idle signal state. Another embodiment periodically resets the first signal from the Active signal state to the Idle signal state, and presets the mask signal to the Mask signal state after the first signal makes a transition from the Active signal state to the Idle signal state.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A circuit, comprising:
   a gate having a first input, a second input and an output;
   a first line adapted for presenting a raw signal to the first input, wherein the raw signal makes transitions between an Active signal state and an Idle signal state;
   a second line adapted for presenting a first control signal to the second input, wherein the first control signal makes transitions between a Mask signal state and an Unmask signal state; and
   a feedback line adapted for latching the output of the gate to the second input of the gate.

2. The circuit of claim 1, further comprising a third line adapted for presenting a second control signal that controls whether the first control signal is presented to the second input of the gate.

3. The circuit of claim 1, further comprising a transmission gate positioned on the second line, and a third line adapted for presenting a second control signal to the transmission gate, wherein the second control signal controls whether the first control signal passes through the transmission gate and is presented to the second input of the gate.

4. The circuit of claim 1, wherein the gate comprises a NAND gate and the feedback line comprises an inverting gate.

5. The circuit of claim 1, further comprising a latch positioned on the first line.

6. The circuit of claim 1, wherein the raw signal and the first control signal provide at least one non-destructive circuit state and at least one potentially destructive circuit state.

7. The circuit of claim 6, wherein:
   the at least one non-destructive circuit state includes an Idle Unmask state, an Idle Mask state, and an Active Mask state;
   the at least one potentially destructive circuit state includes an Active Unmask state; and
   a transition from the non-destructive Idle Unmask state to the non-destructive Active Mask state progresses through the non-destructive Idle Mask state.

8. A memory control circuit, comprising:
   a first input node upon which a first state signal makes transitions between an Active signal state and an Idle signal state;
   a second input node upon which a second state signal makes transitions between a Mask signal state and an Unmask signal state;
   an output node upon which is generated an output signal that corresponds to the first state signal and the second state signal;
   wherein the first state signal and the second state signal provide non-destructive circuit states that include an Idle Unmask state, an Idle Mask state, and an Active Mask state, and further provide at least one potentially destructive circuit state that includes an Active Unmask state; and
   wherein a transition from the non-destructive Idle Unmask state to the non-destructive Active Mask state progresses through the non-destructive Idle Mask state.

9. The memory control circuit of claim 8, wherein the second state signal is reset to the Mask signal state after the first state signal makes a transition from the Active signal state to the Idle signal state.

10. The memory control circuit of claim 8, wherein a feedback line is coupled between the output node and the second input node.

11. The memory control circuit of claim 8, further comprising a transmission gate coupled to the second input node, wherein:
    the transmission gate is adapted for passing the second state signal for a period of time after the Active signal state is generated on the first input node and for isolating the second input node after the period of time until a successive Active signal state is generated on the first input node; and
    the isolated second node input is reset to the Mask signal state after the first node completes a transition between the Active signal state to the Idle signal state.

12. The memory control circuit of claim 8, wherein:

the active state signal comprises a raw write signal;

the non-destructive circuit states include an Idle Unmask state, an Idle Mask state, and a Write Mask state; and the potentially destructive circuit state includes a Write Unmask state.

13. A preset masking circuit, comprising:

a gate having a first input, a second input and an output;

a first line adapted for presenting a raw signal to the first input of the gate;

a mask line adapted for presenting a mask control signal to the second input of the logic gate;

a timing control line adapted for presenting a timing control signal that controls whether the mask control signal passes to the second input of the gate; and a feedback line adapted for presetting the mask control signal by latching the output of the gate to the second input of the gate.

14. The preset masking circuit of claim 13, wherein the gate comprises a NAND gate and the feedback line comprises an inverting gate.

15. The preset masking circuit of claim 13, wherein the mask control signal prevents the raw signal from producing an output signal at the output of the gate when the mask control signal is in a Mask signal state.

16. The preset masking circuit of claim 13, wherein the raw signal makes transitions between an Active signal state and an Idle signal state, and the Mask control signal makes transitions between a Mask signal state and an Unmask signal state.

17. A preset masking circuit, comprising:

a gate having a first input, a second input and an output;

a first line adapted for presenting a raw signal to the first input of the gate, wherein the raw signal makes transitions between an Active signal state and an Idle signal state;

a mask line adapted for presenting a mask control signal to the second input of the logic gate, wherein the mask signal makes transitions between a Mask signal state and an Unmask signal state;

a timing control line adapted for presenting a timing control signal that controls whether the mask control signal passes to the second input of the gate;

a feedback line adapted for presetting the mask control signal by latching the output of the gate to the second input of the gate; and wherein the raw signal, the mask control signal and the timing control signal provide at least one non-destructive circuit state and at least one destructive circuit state.

18. The preset masking circuit of claim 17, wherein:

the at least one non-destructive circuit state includes an Idle Unmask state, an Idle Mask state, and an Active Mask state;

the at least one destructive circuit state includes an Active Unmask state; and a transition from the non-destructive Idle Unmask state to the non-destructive Active Mask state progresses through the non-destructive Idle Mask state.

19. A write masking circuit for a memory device, comprising:

a gate having a first input, a second input and an output;

a write line adapted for presenting a write signal to the first input of the gate;

a mask line adapted for presenting a mask signal to the second input of the gate;

a timing control line adapted for presenting a timing control signal that controls whether the mask signal passes to the second input of the gate; and a feedback line adapted for latching the output to the second input of the gate.

20. The write masking circuit of claim 19, wherein the gate comprises a NAND gate and the feedback line comprises an inverting gate.

21. The write masking circuit of claim 19, wherein the mask signal prevents the raw signal from producing an output signal at the output of the gate.

22. The write masking circuit of claim 19, wherein:

the write signal, the mask signal and the timing control signal provide at least one non-destructive circuit state and at least one destructive circuit state;

the at least one non-destructive circuit state includes an Idle Unmask state, an Idle Mask state, and a Write Mask state;

the at least one destructive circuit state includes a Write Unmask state; and a transition from the non-destructive Idle Unmask state to the non-destructive Write Mask state progresses through the non-destructive Idle Mask state.

23. A write masking circuit for a memory device, comprising:

a mask control gate having a first input, a second input and an output;

a resettable write portion coupled to a raw write line and adapted for presenting a resettable write signal to the first input of the mask control gate;

a mask line adapted for presenting a mask control signal to the second input of the mask control gate;

a timing control line adapted for presenting a timing control signal that controls whether the mask control signal passes to the second input of the mask control gate; and a feedback line adapted for latching the output to the second input of the gate.

24. The write masking circuit of claim 23, wherein the mask control gate comprises a NOR gate.

25. The write masking circuit of claim 23, wherein the feedback line comprises an inverting gate.

26. The write masking circuit of claim 23, wherein the mask control signal prevents the raw signal from producing an output signal at the output of the mask control gate when the mask control signal is in a Mask signal state.

27. The write masking circuit of claim 23, wherein:

the write signal, the mask signal and the timing control signal provide at least one non-destructive circuit state and at least one destructive circuit state;

the at least one non-destructive circuit state includes an Idle Unmask state, an Idle Mask state, and a Write Mask state;

the at least one destructive circuit state includes a Write Unmask state; and transition from the non-destructive Idle Unmask state to the non-destructive Write Mask state progresses through the non-destructive Idle Mask state.

28. A write masking circuit for a memory device, comprising:

a mask control gate having a first input, a second input and an output;

a resettable write portion coupled to a raw write line and adapted for presenting a resettable write signal to the first input of the mask control gate;

a mask line adapted for presenting a mask control signal to the second input of the mask control gate;

a mask transmission gate positioned on the mask line;

a mask timing control line adapted for presenting a mask timing control signal to the mask transmission gate that controls whether the mask control signal passes to the second input of the mask control gate;

a mask feedback line adapted for latching the output of the mask control gate to the second input of the mask control gate; and wherein the resettable write portion includes:
  a write control gate having a first input, a second input and an output;
  a write reset pulse generator coupled to the first input of the write control gate;
  a raw write line adapted for presenting a raw write signal to the second input of the write control gate;
  a write transmission gate positioned on the raw write line;
  a write timing control line adapted for presenting a write timing control signal to the write transmission gate that controls whether the raw write signal passes to the second input of the write control gate; and
  a write feedback line adapted for latching the output of the write control gate to the second input of the write control gate.

29. The write masking circuit of claim 28, wherein:
the write control gate comprises a NAND gate;
the mask control gate comprises a NOR gate; and
the mask feedback line and the write feedback line each comprise an inverting gate.

30. The write masking circuit of claim 28, wherein the raw write signal, the mask control signal and the timing control signal provide at least one non-destructive circuit state and at least one destructive circuit state.

31. The write masking circuit of claim 30, wherein:
the non-destructive circuit state includes an Idle Unmask state, an Idle Mask state, and a Write Mask state;
the destructive circuit state includes a Write Mask state; and
a transition from the non-destructive Idle Unmask state to the non-destructive Write Mask state progresses through the non-destructive Idle Mask state.

32. The write masking circuit of claim 28, wherein:
the second input of the write control gate is periodically reset and latched to an Idle signal state; and
in response to the reset second input of the write control gate, the second input of the mask control gate is reset and latched to a Mask signal state.

33. A memory device, comprising:
a memory array including a plurality of memory cells;
a memory controller adapted for providing addressing signals and control signals to write to and to retrieve data from the memory array, the control signals including a raw write signal, a mask control signal, and a timing signal; and
a mask preset circuit adapted for receiving the raw write signal and the mask signal to produce a write enable signal that controls whether data is written to the memory array, and wherein the mask preset circuit comprises:

a first input node upon which the raw write signal makes transitions between a write state signal and an idle state signal;
  a second input node upon which the mask control signal makes transitions between a Mask signal state and an Unmask signal state;
  an output node upon which the write enable signal is generated;
  wherein the raw write signal and the mask control signal provide an Idle Unmask state, an Idle Mask state, a Write Mask state, and a Write Unmask state; and
  wherein a transition between the Idle Unmask state to the Write Mask state progresses through the Idle Mask state.

34. The memory device of claim 33, wherein the write enable signal controls whether I/O drivers are enabled.

35. The memory device of claim 34, wherein the I/O drivers are formed in the memory controller.

36. The memory device of claim 34, wherein the I/O drivers are formed in the memory array.

37. The memory device of claim 33, wherein the memory controller is incorporated into a microprocessor.

38. The memory device of claim 33, further comprising a microprocessor coupled to the memory controller.

39. A memory device, comprising:
a memory array including a plurality of memory cells;
a memory controller providing addressing signals and control signals adapted for writing to and for retrieving data from the memory array, the control signals including a raw write signal on a raw write line and a mask control signal on a mask line; and
a mask preset circuit adapted for producing a write enable signal from the raw write signal, and the mask control signal, wherein the write enable signal controls whether data is written to the memory array, and wherein the mask preset circuit comprises:
  a gate having a first input coupled to the raw write line, a second input coupled to the mask line and an output adapted for providing the write enable signal; and
  a feedback line adapted for latching the output of the gate to the second input of the gate.

40. The memory device of claim 39, wherein the control signals include a timing signal that controls whether the mask control signal is presented to the second input of the gate.

41. The memory device of claim 39, further comprising a transmission gate positioned on the mask line, and wherein the control signals include a timing signal that is presented to the transmission gate on a latch timing line, wherein the timing signal controls whether the mask control signal passes through the transmission gate and is presented to the second input of the gate.

42. The memory device of claim 39, wherein the gate comprises a NAND gate and the feedback line comprises an inverting gate.

43. The memory device of claim 39, further comprising a latch positioned on the raw write line.

44. The memory device of claim 39, wherein:
the raw write signal makes transitions between an Active signal state and an Idle signal state and the first control signal makes transitions between a Mask signal state and an Unmask signal state;
the raw signal and the first control signal provide at least one non-destructive circuit state that includes an Idle Unmask state, an Idle Mask state, and an Active Mask state, and further provide at least one potentially destructive circuit state that includes an Active Unmask state; and a transition between the non-destructive Idle Unmask state to the non-destructive Active Mask state progresses through the non-destructive Idle Mask state.

45. A write masking method, comprising:

providing a preset masking circuit;

presenting a raw write signal and a mask control signal to the preset masking circuit, wherein:
- the raw write signal makes transitions between an Active signal state and an Idle signal state; and
- the mask control signal makes transitions between a Mask signal state and an Unmask signal state; and making a transition from a non-destructive Idle Unmask state to a non-destructive Write Mask state through a non-destructive Idle Mask state.

46. The write masking method of claim 45, further comprising resetting the mask control signal to the Mask signal state upon completing a raw write signal transition from the Active signal state to the Idle signal state.

47. The write masking method of claim 45, further comprising:

providing both a transmission gate and a latch positioned along a mask line;

providing a latch timing pulse to the transmission gate; and wherein presenting a mask control signal comprises transmitting the mask control signal through a transmission gate and into a latch during the latch timing pulse.

48. A method for masking writes into a memory array, comprising:

receiving a raw write signal;

in response to receiving the raw write signal, generating a resettable write signal;

periodically resetting the resettable write signal from an Active signal state to an Idle signal state;

receiving a mask control signal that makes transitions between a Mask signal state and an Unmask signal state;

presenting the resettable write signal and the mask control signal to a mask control gate;

in response to receiving the mask control signal in an Unmask signal state and to receiving the resettable write signal an Active signal state, generating an output signal;

in response to receiving the mask control signal in a Mask signal state or resettable write signal in an Idle signal state, generating an inactive output signal; and presetting the mask control signal to a Mask signal state by latching the inactive output signal to an input of the mask control gate.

49. The method of 48, further comprising presetting the raw write signal to an Inactive signal state by latching a resettable write signal in an Idle signal state to a raw write line upon which the raw write signal is generated.

50. A method of protecting an integrated circuit, comprising:

providing a first signal, wherein the first signal makes transitions between an Active signal state and an Idle signal state;

providing a second signal, wherein the second signal makes transitions between a Mask signal state and an Unmask signal state;

forming at least one non-destructive circuit state and at least one potentially destructive circuit state from the first signal and the second signal, wherein the at least one non-destructive circuit state includes an Idle Unmask state, an Idle Mask state, and an Active Mask state and the at least one potentially destructive circuit state includes an Active Unmask state; and making a transition from the non-destructive Idle Unmask state to the non-destructive Active Mask state through the non-destructive Idle Mask state.

51. The method of claim 50, wherein, upon completing a first signal transition from the Active signal state to the Idle signal state, the second signal is reset to the Mask signal state.

52. The method of claim 50, wherein the first signal is periodically reset and latched to the Idle signal state until a subsequent first signal in the Active signal state is received.

53. The method of claim 52, wherein, in response to first signal in the Idle signal state, the second signal is reset and latched to the Mask signal state until a subsequent second signal in the Unmask signal state is received.

* * * * *

UNITED STATES PATENT AND TRADEMARK OFFICE
CERTIFICATE OF CORRECTION

PATENT NO. : 6,400,613 B1
DATED : June 4, 2002
INVENTOR(S) : Donald M. Morgan

It is certified that error appears in the above-identified patent and that said Letters Patent is hereby corrected as shown below:

<u>Title page,</u>
*Attorney, Agent, or Firm*, delete "Wossner" and insert -- Woessner --, therefor.

<u>Column 5,</u>
Line 52, delete "an" and insert -- a --, therefor.

<u>Column 10,</u>
Line 12, delete "☐" in "a☐microprocessor", therefor.

<u>Column 18,</u>
Line 8, insert -- claim -- before "48", therefor.

Signed and Sealed this

Sixth Day of August, 2002

*Attest:*

JAMES E. ROGAN
*Attesting Officer*  *Director of the United States Patent and Trademark Office*